(12) United States Patent
Sugioka et al.

(10) Patent No.: US 10,651,100 B2
(45) Date of Patent: May 12, 2020

(54) SUBSTRATES, STRUCTURES WITHIN A SCRIBE-LINE AREA OF A SUBSTRATE, AND METHODS OF FORMING A CONDUCTIVE LINE OF A REDISTRIBUTION LAYER OF A SUBSTRATE AND OF FORMING A STRUCTURE WITHIN A SCRIBE-LINE AREA OF THE SUBSTRATE

(71) Applicant: Micron Technology, Inc., Boise, ID (US)

(72) Inventors: Shigeru Sugioka, Hiroshima (JP); Kiyonori Oyu, Tokyo (JP); Hiroshi Toyama, Kanagawa (JP); Jung Chul Park, San Jose, CA (US); Raj K. Bansal, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/981,619

(22) Filed: May 16, 2018

(65) Prior Publication Data

US 2019/0355631 A1 Nov. 21, 2019

(51) Int. Cl.
*H01L 23/528* (2006.01)
*H01L 21/66* (2006.01)
(Continued)

(52) U.S. Cl.
CPC ........ *H01L 22/32* (2013.01); *H01L 21/76802* (2013.01); *H01L 21/76877* (2013.01); *H01L 23/528* (2013.01); *H01L 23/5329* (2013.01)

(58) Field of Classification Search
CPC ............... H01L 22/32; H01L 21/76802; H01L 21/76877; H01L 23/528; H01L 23/5329
See application file for complete search history.

(56) References Cited

U.S. PATENT DOCUMENTS 6,245,659 B1 * 6/2001 Ushiyama ......... H01L 21/02126
257/E21.169
7,075,107 B2 7/2006 Chen et al.
(Continued)

FOREIGN PATENT DOCUMENTS

EP 0536968 4/1993
JP H05343371 12/1993
(Continued)

OTHER PUBLICATIONS

U.S. Appl. No. 15/981,599, filed May 16, 2018, by Sugioka et al.
(Continued)

*Primary Examiner* — Matthew C Landau
*Assistant Examiner* — Dmitriy Yemelyanov
(74) *Attorney, Agent, or Firm* — Wells St. John P.S.

(57) ABSTRACT

A substrate comprises a pair of immediately-adjacent integrated-circuit dies having scribe-line area there-between. At least one of the dies comprises insulting material above integrated circuitry. The insulating material has an opening therein that extends elevationally inward to an upper conductive node of integrated circuitry within the one die. The one die comprises a conductive line of an RDL above the insulating material. The RDL-conductive line extends elevationally inward into the opening and is directly electrically coupled to the upper conductive node. The insulating material has a minimum elevational thickness from an uppermost surface of the upper conductive node to an uppermost surface of the insulating material that is immediately-adjacent the insulating-material opening. Insulator material is above a conductive test pad in the scribe-line area. The insulator material has an opening therein that extends elevationally inward to an uppermost surface of the conductive test pad. The insulator material has a minimum elevational thickness from the conductive-test-pad uppermost surface to (Continued)

an uppermost surface of the insulator material that is immediately-adjacent the insulator-material opening and that is less than said minimum elevational thickness of the insulating material. Methods are disclosed.

17 Claims, 10 Drawing Sheets

(51) Int. Cl.
*H01L 23/532* (2006.01)
*H01L 21/768* (2006.01)

(56) References Cited

U.S. PATENT DOCUMENTS

| | | |
|---|---|---|
| 2004/0004284 A1 | 1/2004 | Lee et al. |
| 2006/0183312 A1* | 8/2006 | Hu .................. H01L 21/312 |
| | | 438/613 |
| 2009/0202926 A1 | 8/2009 | Yasuzato |
| 2010/0301491 A1 | 12/2010 | Yang |
| 2013/0009656 A1 | 1/2013 | Wu |
| 2013/0237053 A1 | 9/2013 | Ishizaka et al. |
| 2014/0061929 A1 | 3/2014 | Inaba et al. |
| 2015/0115442 A1 | 4/2015 | Meyer-Berg et al. |
| 2016/0276237 A1* | 9/2016 | Lin .................. H01L 23/49816 |
| 2016/0284384 A1 | 9/2016 | Kim |
| 2016/0379946 A1 | 12/2016 | Maekawa et al. |
| 2017/0025593 A1 | 1/2017 | Bower et al. |
| 2017/0062321 A1 | 3/2017 | Choi et al. |
| 2017/0170111 A1 | 6/2017 | Reingruber et al. |
| 2017/0243815 A1 | 8/2017 | Reingruber et al. |
| 2017/0243839 A1 | 8/2017 | Buckalew et al. |

FOREIGN PATENT DOCUMENTS

| | | |
|---|---|---|
| JP | 2012-174789 | 9/2012 |
| JP | 2014-053369 | 3/2014 |
| JP | 2014-204014 | 10/2014 |

OTHER PUBLICATIONS

Garrou et al., "RDL: an integral part of today's advanced packaging technologies", available online at: hhtp:/eletroiq.com/blog/2011/05/rdl-an-integral-part-of-today-s-advanced/, May 2011, 7 pages.

* cited by examiner

SUBSTRATES, STRUCTURES WITHIN A SCRIBE-LINE AREA OF A SUBSTRATE, AND METHODS OF FORMING A CONDUCTIVE LINE OF A REDISTRIBUTION LAYER OF A SUBSTRATE AND OF FORMING A STRUCTURE WITHIN A SCRIBE-LINE AREA OF THE SUBSTRATE

TECHNICAL FIELD

Embodiments disclosed herein pertain to substrates, to structures within a scribe-line area of a substrate, and to methods of forming a conductive line of a redistribution layer of a substrate and of forming a structure within a scribe-line area of the substrate.

BACKGROUND

Multiple integrated circuit structures are typically fabricated within individual die area of a larger substrate and have scribe-line area between immediately-adjacent die areas. The structures are singulated (cut) into individual dies or chips typically by mechanically sawing through the scribe-line area. Sacrificial test circuitry is often in the scribe-line area to enable testing and/or burn-in of the integrated circuitry in the die areas prior to singulation. Such test circuitry typically includes exposed test pads that are contacted by probe pins of test machinery during test and/or burn-in. Sawing through these test pads can propagate cracks into the die area that can render the die inoperable.

The integrated circuit structures typically comprise a redistribution layer that is an upper layer of integrated circuitry that comprises metal material and that makes input/output nodes for the integrated circuitry available in or at other locations within the die.

DETAILED DESCRIPTION OF EXAMPLE EMBODIMENTS

Embodiments of the invention encompass methods of forming a conductive line of a redistribution layer of a substrate and of forming a structure within a scribe-line area of the substrate. Embodiments of the invention also encompass a substrate and a structure within a scribe-line area of a substrate independent of method of manufacture. Example embodiments are initially described with reference to FIGS. 1-14.

Figure 1:
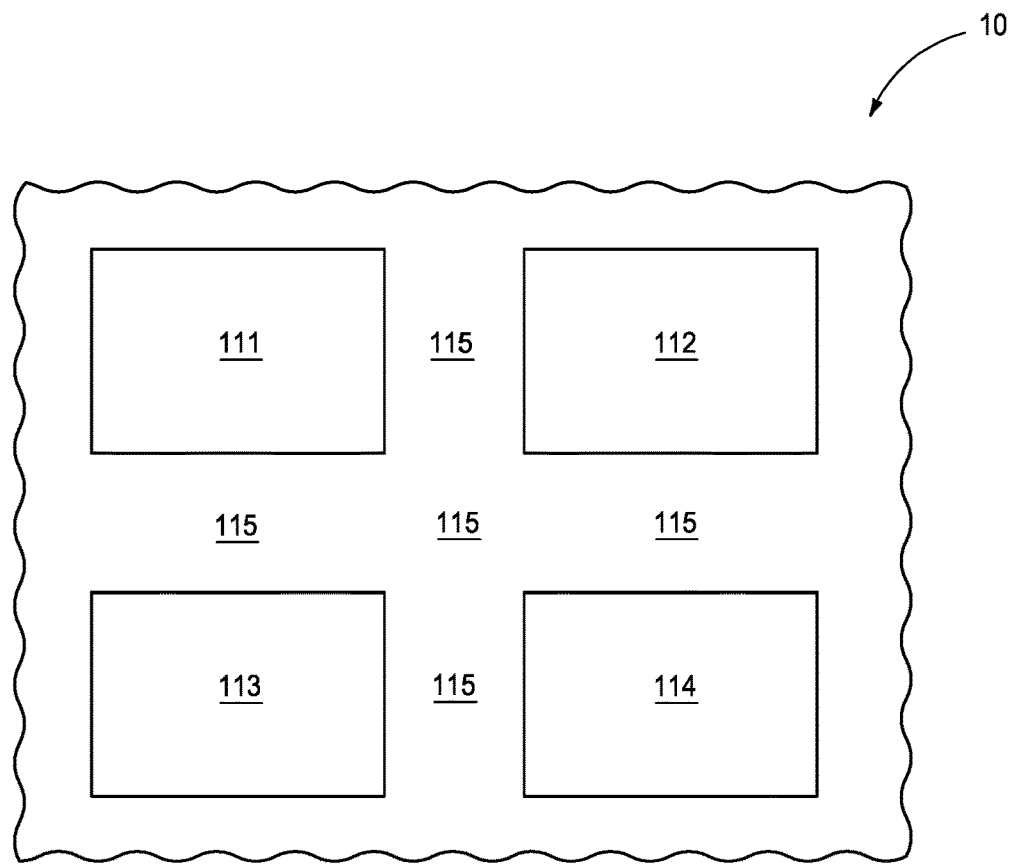
FIG. 1 is a diagrammatic top view of a substrate comprising integrated-circuit dies having scribe-line area therebetween in accordance with an embodiment of the invention.
Figure 2:
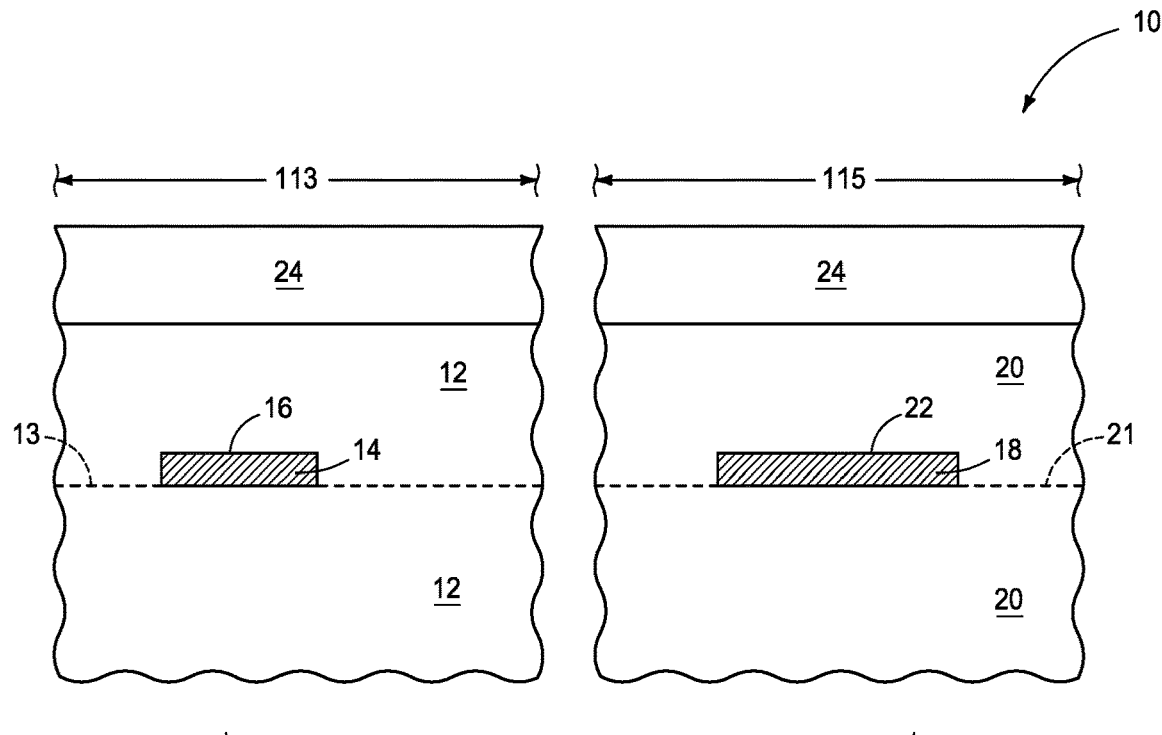
FIG. 2 is an enlarged diagrammatic and fragmentary cross-sectional view of a portion the FIG. 1 substrate in process in accordance with an embodiment of the invention.

Referring to FIGS. 1 and 2, a substrate construction 10 in process of a method in accordance with an embodiment of the invention is shown. Construction 10 has been fabricated to comprise a plurality of die areas 111, 112, 113, and 114 (hereinafter referred to as dies or individual die) having scribe-line area 115 between such dies. Construction 10 of FIG. 1 may, by way of example, be part of a much larger substrate (e.g., a semiconductor wafer) having numerous more dies. Processing is described below relative to forming a pair of immediately-adjacent integrated-circuit dies (i.e., dies that individually comprise integrated circuitry therein) having scribe-line area there-between. Example such pairs include dies 111/112, dies 113/114, dies 111/113, dies 112/114, dies 112/113, and dies 111/114. FIG. 2 is an enlarged sectional view of a small portion of FIG. 1 showing a portion of die 113 and adjacent scribe-line area 115 that may be between any of dies 113 and 111, dies 113 and 112, and/or dies 113 and 114.

Substrate construction 10 may comprise a base substrate (not shown) that may include any one or more of conductive/conductor/conducting (i.e., electrically herein), semiconductive/semiconductor/semiconducting, or insulative/insulator/insulating (i.e., electrically herein) materials. Various materials would typically be formed above the base substrate, with the base substrate and such materials comprising any existing or later-developed integrated circuitry. Dies 111, 112, 113, and 114 individually comprise some upper conductive node 14 of integrated circuitry and insulating material 12 (e.g., doped or undoped silicon dioxide) above upper conductive node 14. The integrated circuitry is otherwise not material to this disclosure. Example upper conductive node 14 is for simplicity shown as a conductive block of material (e.g., metal material, such as TiN) that may be part of a conductive line or a contact pad that electrically couples with the integrated circuitry there-below (not shown). A dashed line 13 is shown within insulating material 12 and may have been a surface upon which upper conductive node 14 was formed, followed by deposition of more or other insulating material 12 there-above. Upper conductive node 14 may be considered as having an uppermost surface 16, and which in one embodiment may be planar as shown.

Scribe-line area 115 comprises a conductive test pad 18 and insulator material 20 directly above conductive test pad 18. Insulating material 12 and insulator material 20 may be the same composition relative one another or may be of different compositions relative one another. Example conductive test pad 18 is for simplicity shown as a conductive block of material (e.g., metal material, such as TiN) that may be part of a conductive line or a contact pad that directly electrically couples with integrated circuitry within die 113 or which directly couples to test or burn-in circuitry (not shown) that is sacrificial and within scribe-line area 115. Materials of constructions 14 and 18 may be the same or of different composition relative one another. A dashed line 21 is shown within insulator material 20 and may have been a surface upon which conductive test pad 18 was formed, followed by deposition of more or other insulator material 20 there-above. Conductive test pad 18 may be considered as having an uppermost surface 22, and which in one embodiment may be planar as shown. In one embodiment and as shown, upper-conductive-node-uppermost surface 16 and conductive-test-pad-uppermost surface 22 are at a same (i.e., common) elevation within the depicted substrate. Radiation-imageable material (RIM) 24 has been formed directly above insulating material 12 and insulator material 20. RIM 24 may be any existing or later-developed material that can be imaged by any existing or later-developed/ discovered radiation, with photoresist being one example.

Materials may be aside, elevationally inward, or elevationally outward of the FIGS. 1 and 2-depicted materials. For example, other partially or wholly fabricated components of integrated circuitry may be provided somewhere above, about, or within the base substrate (not shown). Control and/or other peripheral circuitry for operating components within an array (e.g., an array of memory cells) in the dies may also be fabricated, and may or may not be wholly or partially within an array or sub-array. Further, multiple sub-arrays may also be fabricated and operated independently, in tandem, or otherwise relative one another. In this document, a "sub-array" may also be considered as an array.

Figure 3:
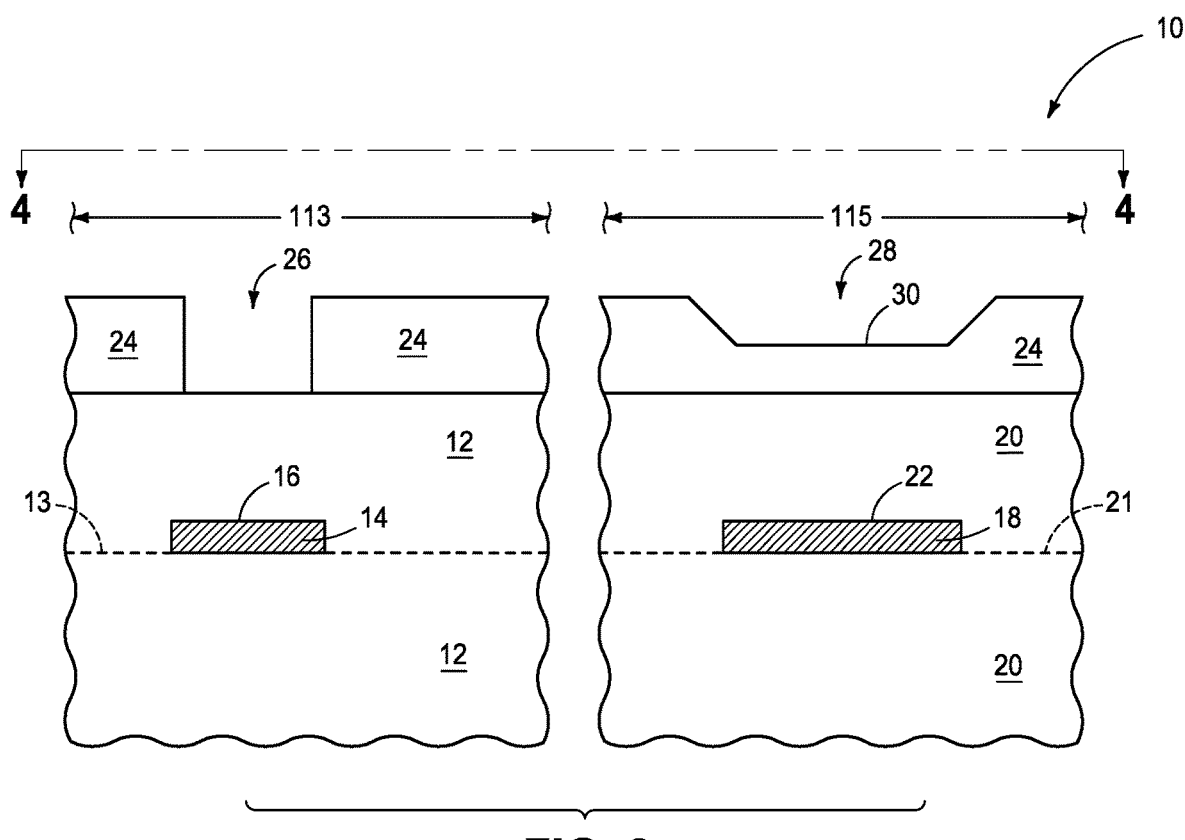
FIG. 3 is a view of the FIG. 2 substrate at a processing step subsequent to that shown by FIG. 2.
Figure 4:
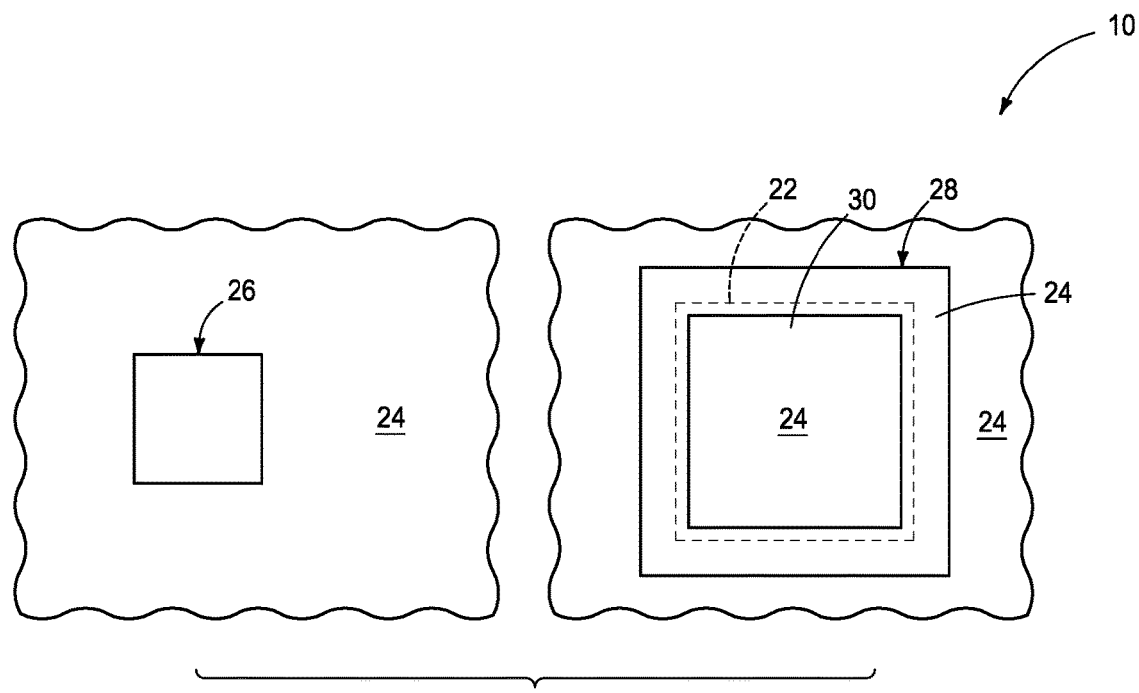
FIG. 4 is a top view the FIG. 3 substrate looking downwardly from line 4-4 in FIG. 3.

Referring to FIGS. 3 and 4, a die opening 26 has been formed through RIM 24 to insulating material 12 directly above upper conductive node 14 in individual of the dies. A test-pad opening 28 has been formed into RIM 24 directly above conductive test pad 18. Test-pad opening 28 may be considered as having a bottom 30. RIM 24 is elevationally between bottom 30 of RIM-test-pad opening 28 and insulator material 20.

Figure 5:
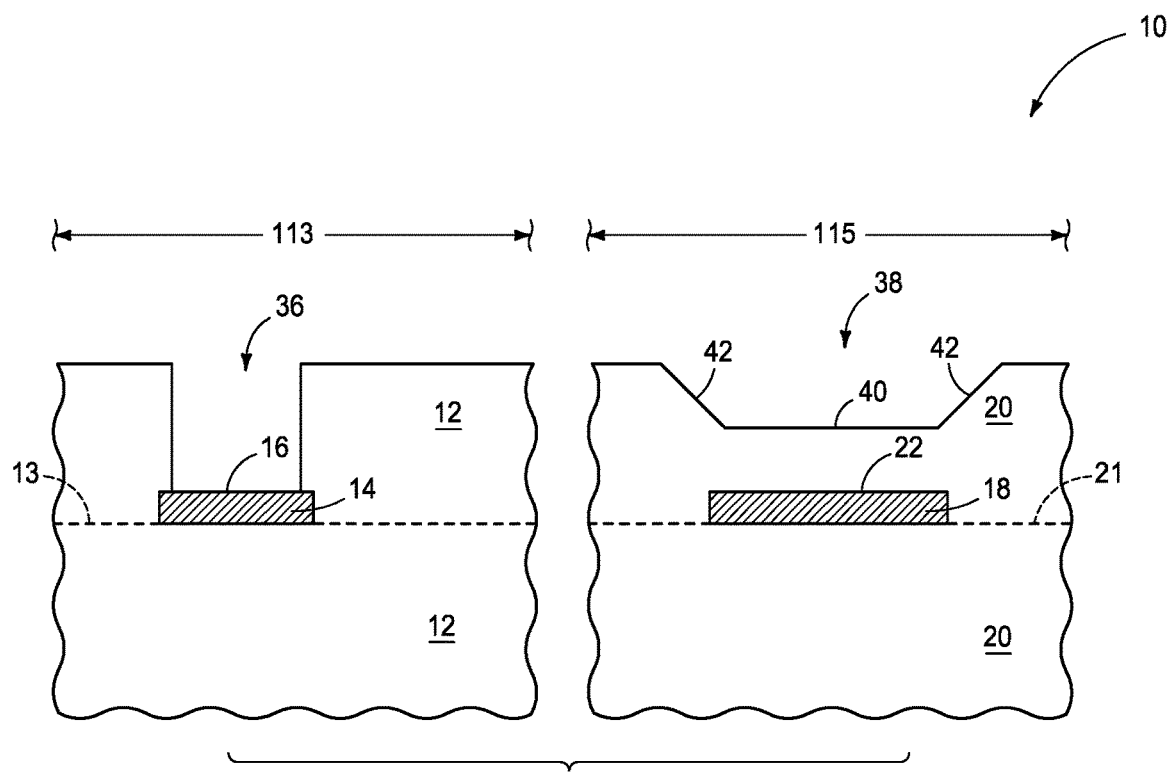
FIG. 5 is a view of the FIG. 3 substrate at a processing step subsequent to that shown by FIG. 3.

Referring to FIG. 5, RIM 24 (not shown) has been used as masking material while simultaneously etching: (a) insulating material 12 through RIM-die opening 26 (not shown) to form an insulating-material opening 36 to upper conductive node 14, and b) insulator material 20 through RIM-test-pad opening 28 (not shown) to form an insulator-material opening 38 directly above conductive test pad 18. Insulator-material opening 38 may be considered as having a bottom 40 and sidewalls 42. Insulator material 20 is elevationally between bottom 40 of insulator-material opening 38 and conductive test pad 18. RIM 24 may be wholly or partially removed while etching insulating material 12 and insulator material 20 and/or removed after such etching has been completed.

Figure 6:
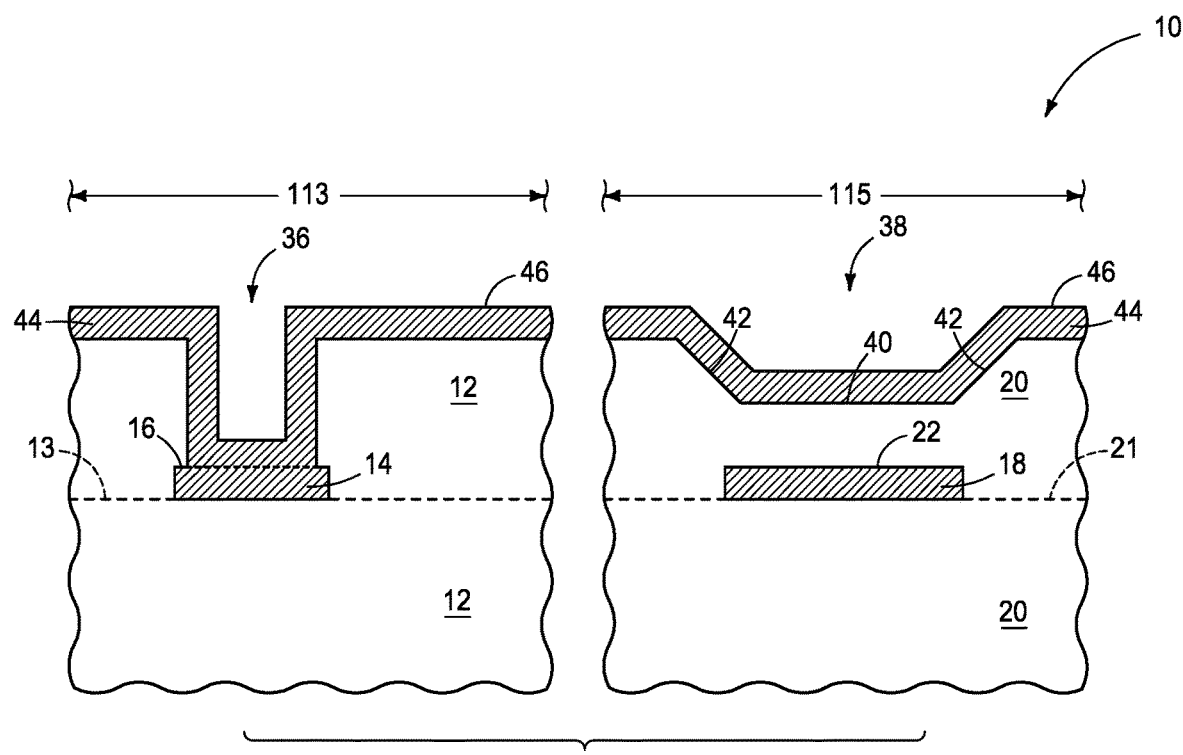
FIG. 6 is a view of the FIG. 5 substrate at a processing step subsequent to that shown by FIG. 5.

Referring to FIG. 6, conductive material 44 of a redistribution layer 46 (i.e., an upper layer of integrated circuitry that comprises metal material and that makes input/output nodes for the integrated circuitry available in or at other locations, and hereafter referred to as RDL) has been formed above insulating material 12 and above insulator material 20 and into insulating-material opening 36 and into insulator-material opening 38. RDL-conductive material 44 is directly electrically coupled to upper conductive node 14. Insulator material 20 is elevationally between RDL-conductive material 44 and conductive test pad 18. RDL-conductive material 44 may be the same or of different composition from that of one or both of upper conductive node 14 and/or conductive test pad 18.

Figure 7:
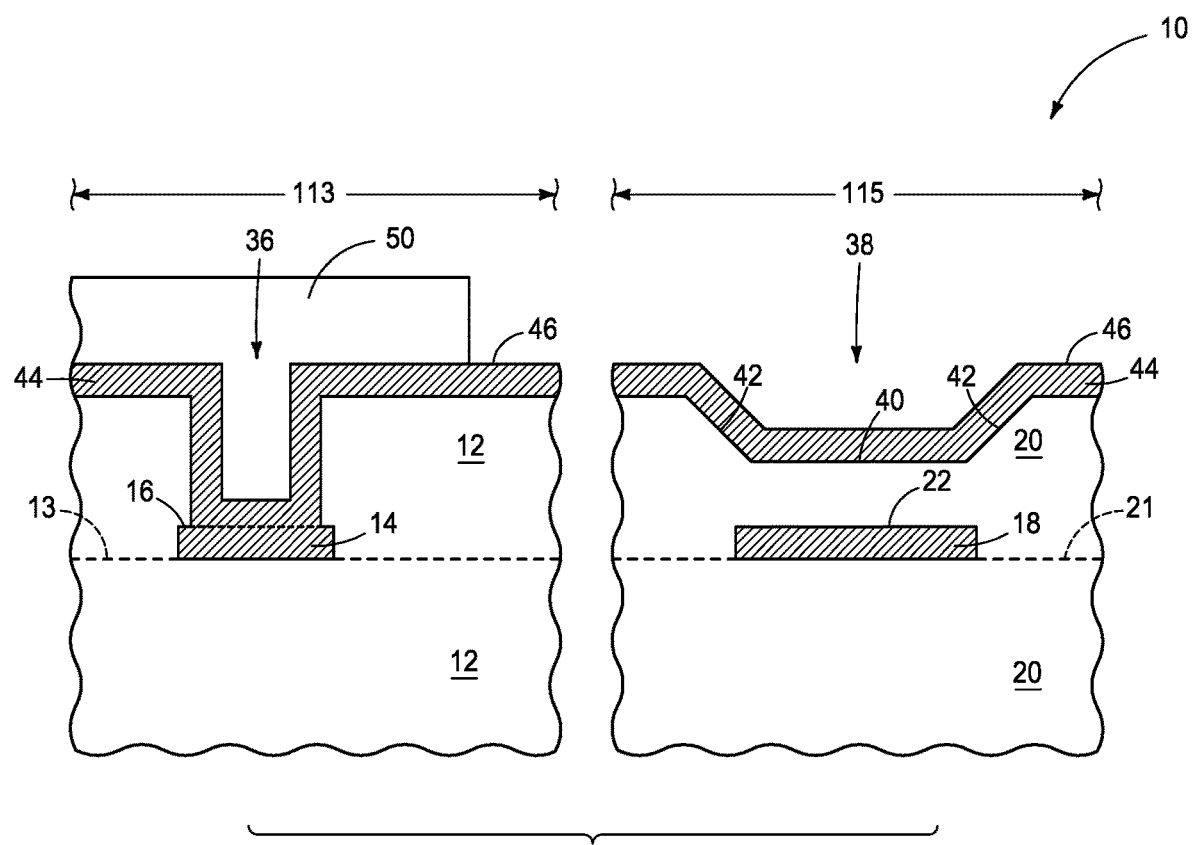
FIG. 7 is a view of the FIG. 6 substrate at a processing step subsequent to that shown by FIG. 6.

Referring to FIG. 7, masking material 50 (e.g., photoresist) has been formed atop RDL 46, and thereafter has been patterned as shown for patterning RDL-conductive material 44 to form a line therefrom. RDL-conductive material 44 has been left outwardly exposed in scribe-line area 115 at least within insulator-material opening 38.

Figure 8:
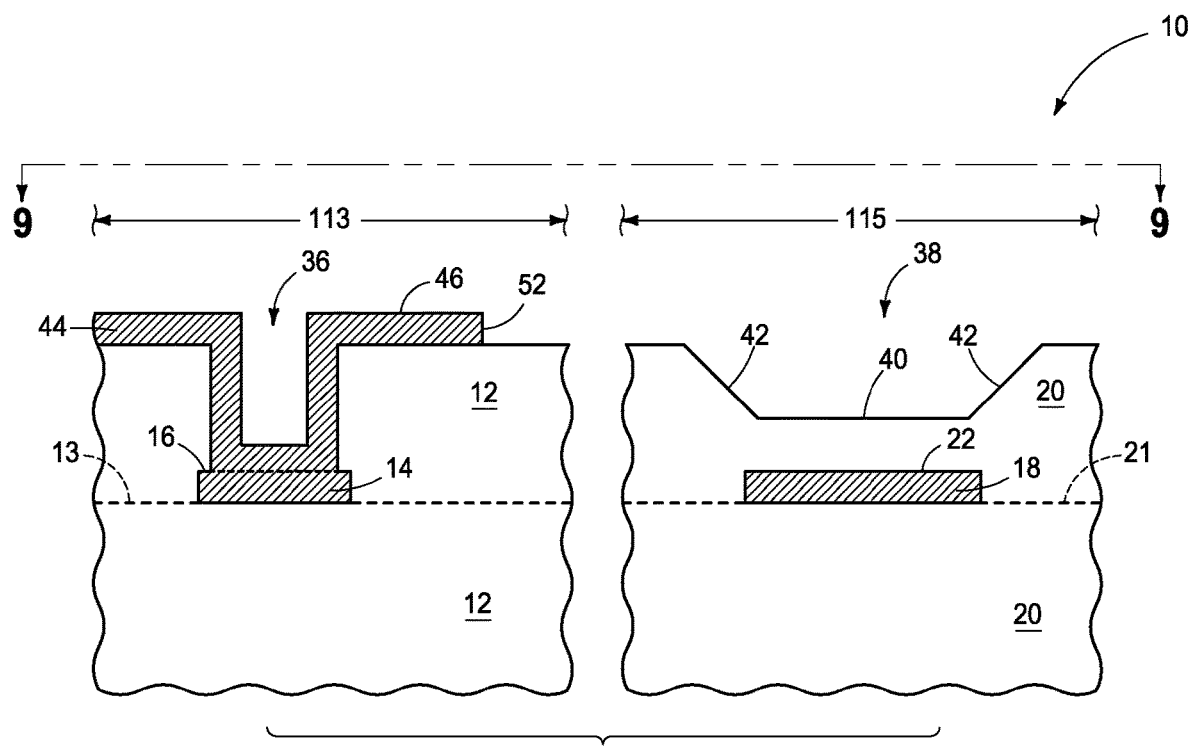
FIG. 8 is a view of the FIG. 7 substrate at a processing step subsequent to that shown by FIG. 7.
Figure 9:
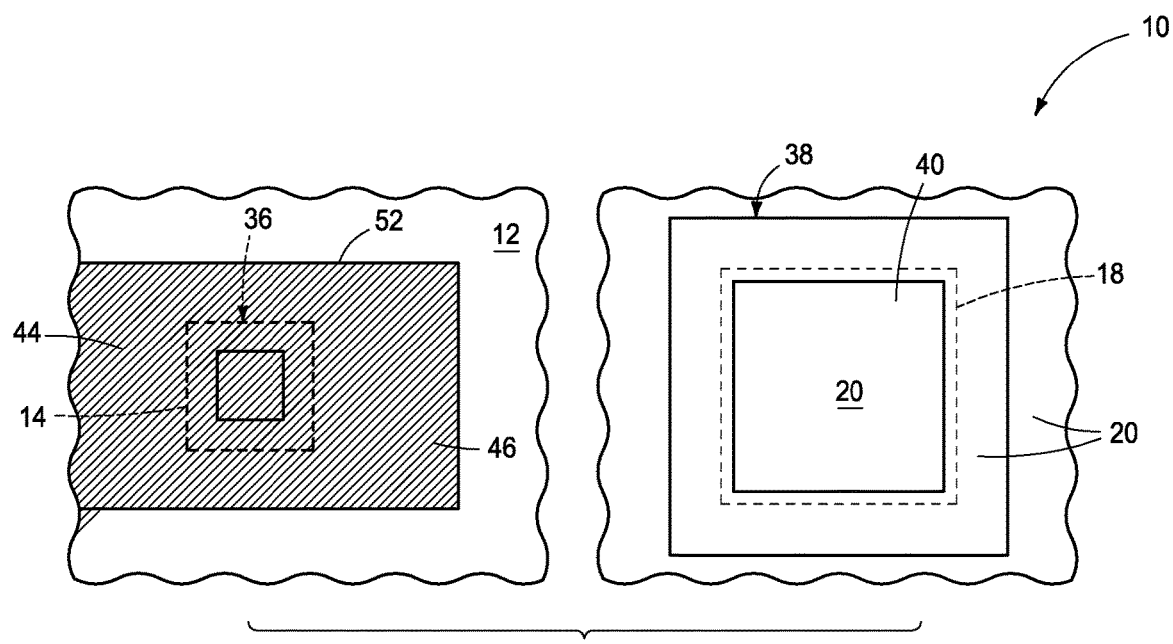
FIG. 9 is a top view the FIG. 8 substrate looking downwardly from line 9-9 in FIG. 8.

Referring to FIGS. 8 and 9, RDL-conductive material 44 has been patterned using masking material 50 (not shown) as a mask to form an RDL-conductive line 52 in individual dies and to remove all of RDL-conductive material 44 from being within insulator-material opening 38. Masking material 50 may be wholly or partially removed while etching RDL-conductive material 44, and/or removed after the etching of RDL-conductive material 44 has been completed.

Figure 10:
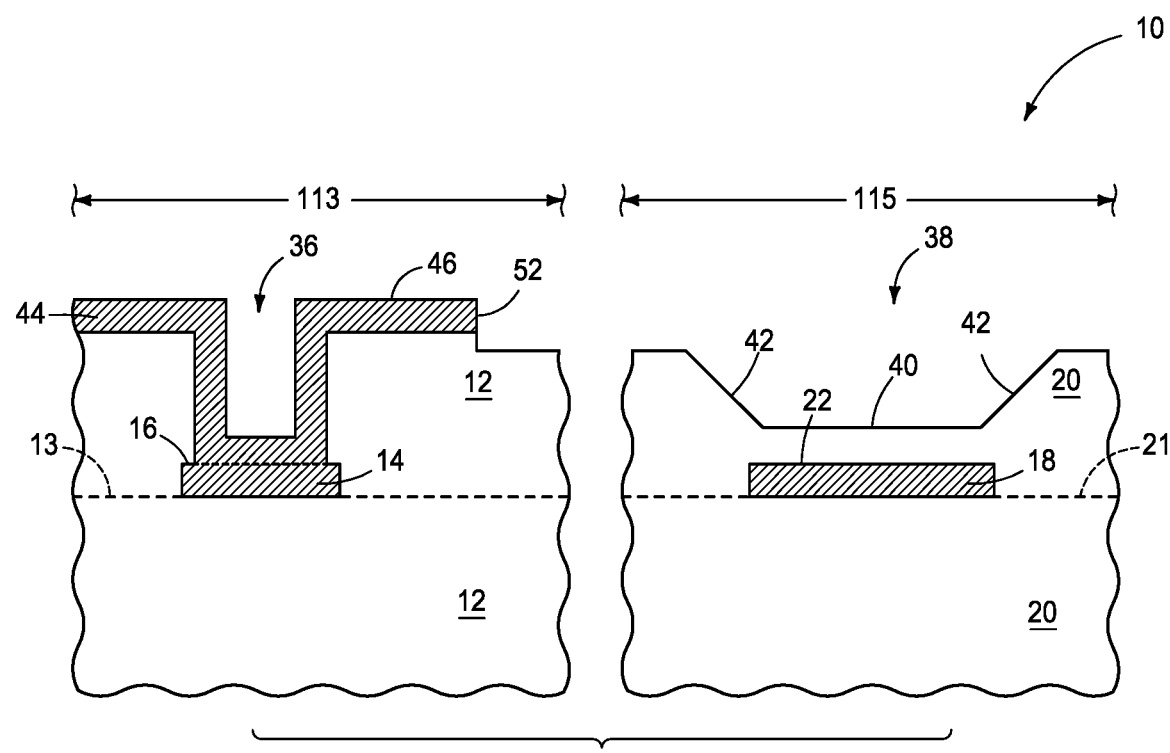
FIG. 10 is a view of the FIG. 8 substrate at a processing step subsequent to that shown by FIG. 8.

Referring to FIG. 10, and in one embodiment, after removing RDL-conductive material 44 from being within insulator-material opening 38, elevational thickness of insulator material 20 aside insulator-material opening 38 has been reduced (e.g., by etching) and in one embodiment and as shown elevational thickness of insulator material 20 inside insulator-material opening 38 has also been reduced. Elevational thickness of insulating material 12 may also be reduced (e.g., by etching) as shown. Such removal of insulating-material 12 may be desired (e.g., an over-etch) to assure complete separation of RDL-conductive material 44 between RDL-conductive lines 52 that are being formed in individual dies.

Figure 11:
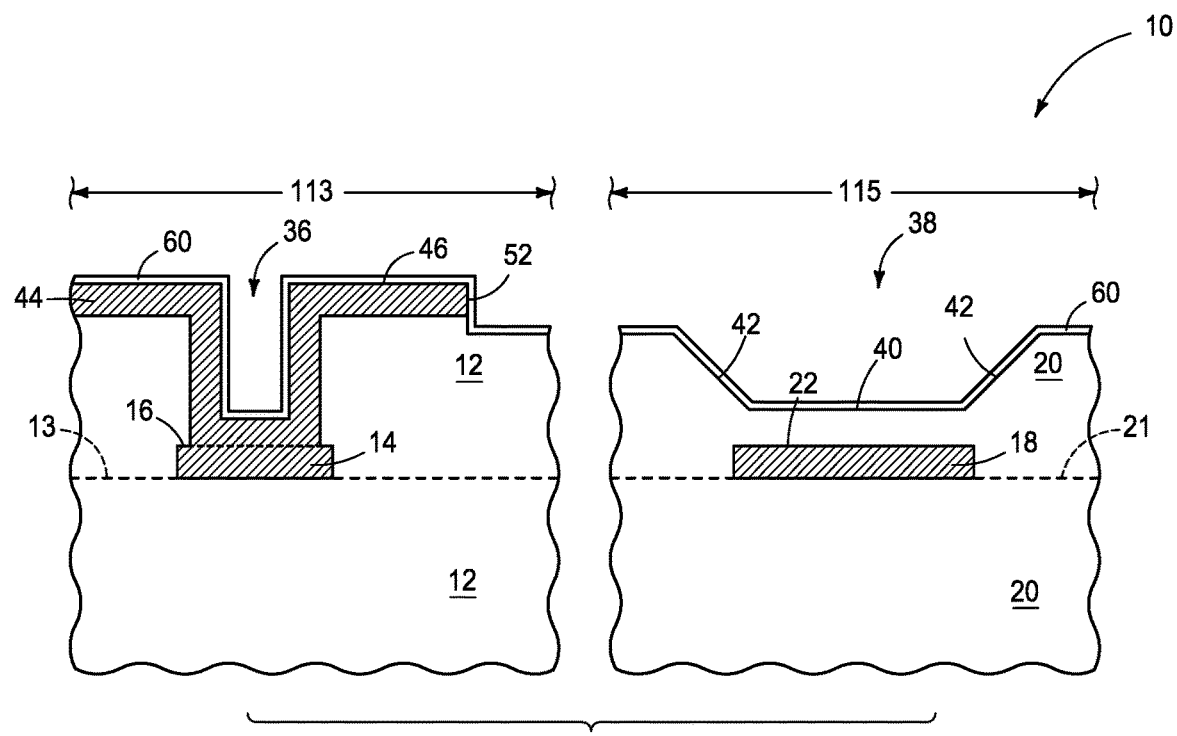
FIG. 11 is a view of the FIG. 10 substrate at a processing step subsequent to that shown by FIG. 10.

Referring to FIG. 11, and in one embodiment, insulative material 60 (e.g., silicon nitride) has been formed directly above, and in one embodiment directly against, RDL-conductive line 52 and within insulator-material opening 38.

Figure 12:
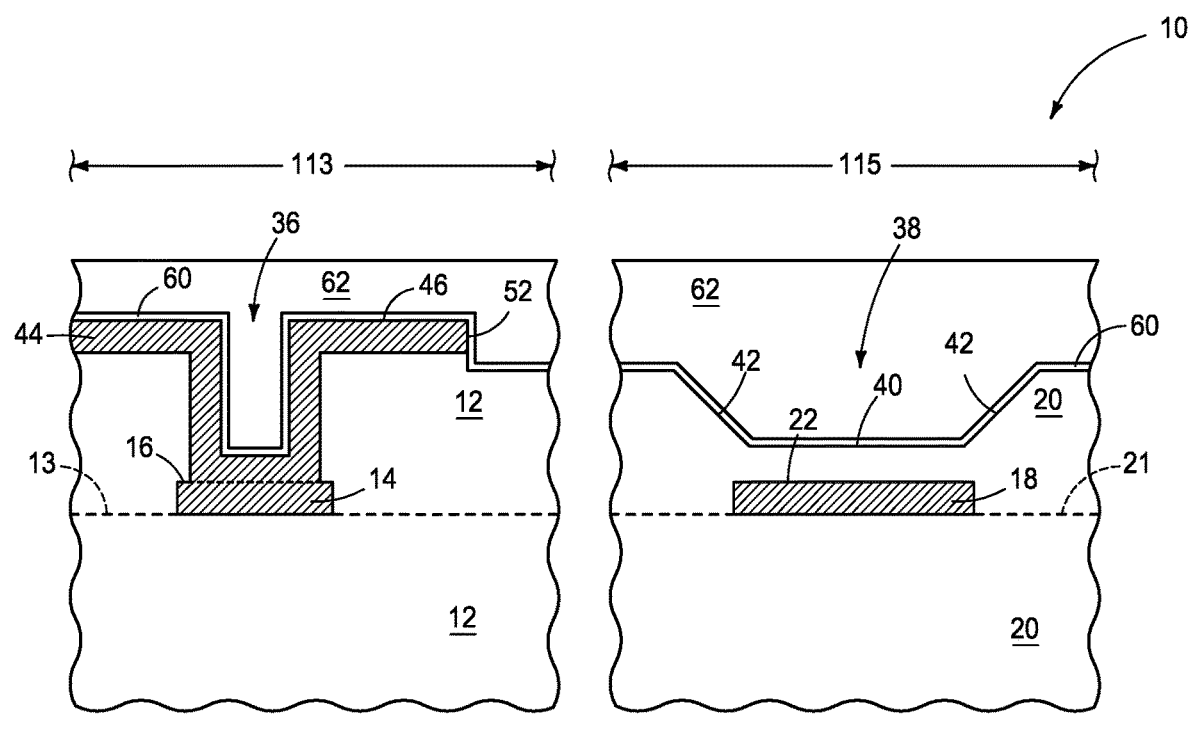
FIG. 12 is a view of the FIG. 11 substrate at a processing step subsequent to that shown by FIG. 11.
Figure 13:
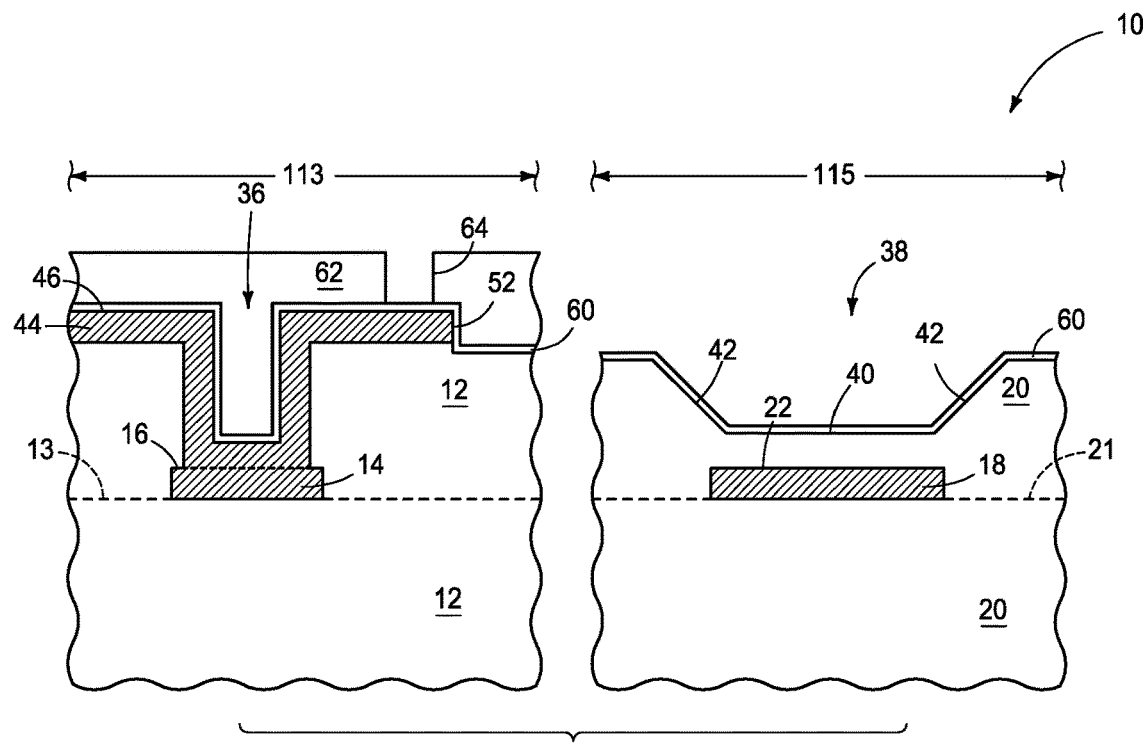
FIG. 13 is a view of the FIG. 12 substrate at a processing step subsequent to that shown by FIG. 12.

Referring to FIG. 12, example subsequent processing is shown wherein a dielectric layer 62 (e.g., polyimide) has been formed over insulative material 60. FIG. 13 shows subsequent processing thereof whereby such has been patterned (e.g., using photolithography) to have an opening 64 extending there-through to insulative material 60 and to remove all of dielectric layer 62 from insulator-material opening 38.

Figure 14:
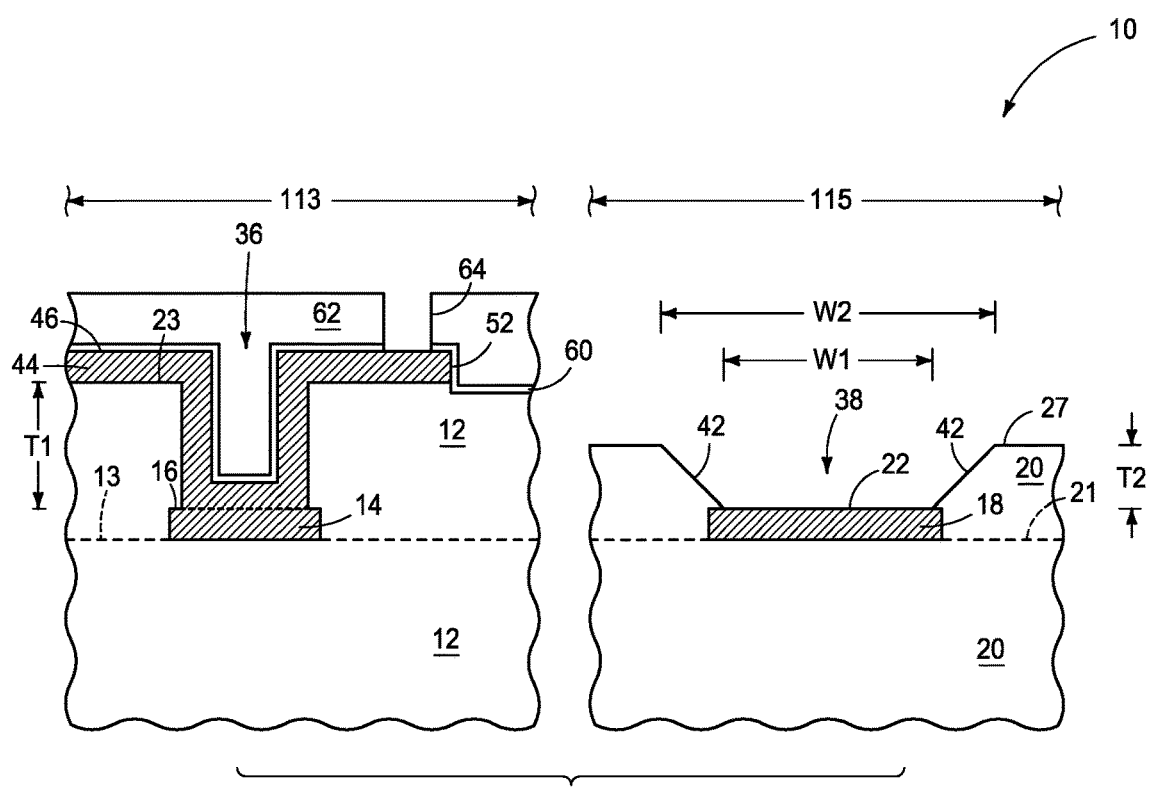
FIG. 14 is a view of the FIG. 13 substrate at a processing step subsequent to that shown by FIG. 13.

Referring to FIG. 14, insulative material 60 has been removed from opening 64 to expose RDL-conductive line 52 and from insulator-material opening 38. A sufficient amount of insulator material 20 has then been removed (e.g., by mask-less selective etching of insulator material 20 relative to dielectric layer 62) from within insulator-material opening 38 to extend insulator-material opening 38 elevationally inward to upwardly expose conductive test pad 18.

In one embodiment, at least a majority of sidewalls 42 of insulator-material opening 30 are at least 25° from vertical, in one embodiment at least 30° from vertical, in one embodiment at least 35° from vertical, and in one embodiment no more than 45° from vertical (with 45° from vertical being shown). Regardless, in one embodiment, at least a majority of sidewalls 42 are straight linear, in one embodiment at least 90% are straight linear, and in one embodiment all are straight linear.

Any other attribute(s) or aspect(s) as shown and/or described herein with respect to other embodiments may be used.

A masking tool (e.g., a mask or reticle) would likely be used to produce RIM-die opening 26 and RIM-test-pad opening 28. Radiation would likely be impinged onto such masking tool through openings therein that would be used to expose desired regions of the RIM for ultimately producing openings 26 and 28 in FIGS. 3 and 4. RIM-die opening 26 is shown as going completely through RIM 24 whereas RIM-test-pad opening does not and includes angled or sloped sidewalls whereas example RIM-die opening 26 does not. To form, by way of example, RIM-test-pad opening 28, openings within the masking tool should allow more radiation there-through onto a mid-portion of what will be opening 28 than onto peripheral portions that are laterally-outward of such mid-portion. Additionally, such masking tool ideally will not allow sufficient radiation through the mid-portion that would result in exposure of the entire thickness of RIM 24 whereby RIM-test-pad opening 28 will not extend completely through RIM 24 as is shown in FIGS. 3 and 4.

Figure 15:
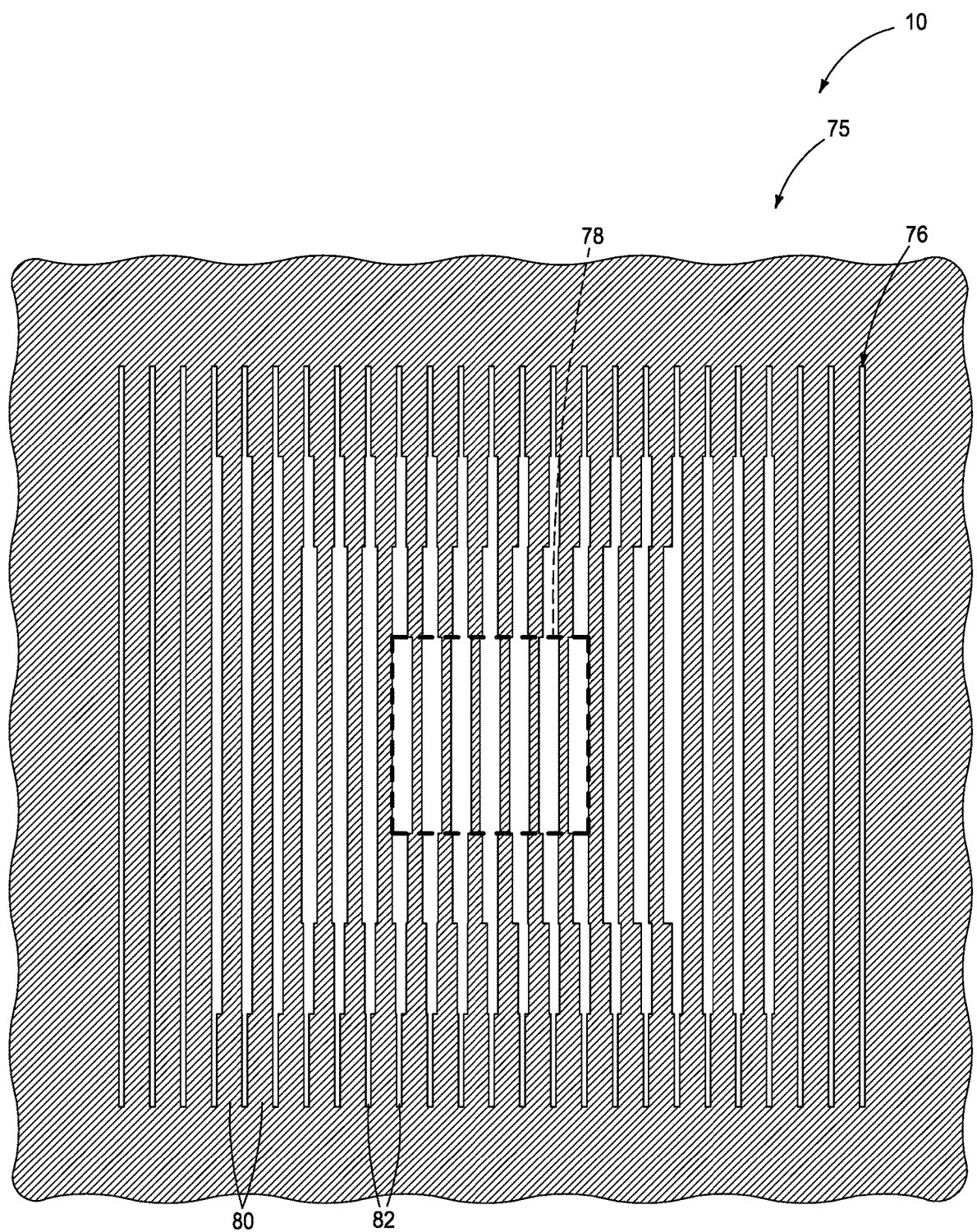
FIG. 15 is an enlarged sectional view of a portion of an example masking tool that may be used to form the construction of FIGS. 3 and 4.

By way of example only, FIG. 15 shows a portion of an example masking tool 75 having some continuous area 76 corresponding in outline to that of RIM-test-pad opening 28 in FIGS. 3 and 4, and is an enlarged view thereof. Masking tool 75 is shown as having spaced elongated linear strips 80 of radiation-blocking material (e.g., chrome) having an elongated radiation-transmissive region 82 (e.g., void space or solid radiation-transmissive material) between immediately-adjacent linear strips 80 in the depicted horizontal cross-section. Masking tool 75 by way of example is shown as having a mid-portion 78 corresponding in size and shape to bottom 30 of RIM-test-pad opening 28 in FIGS. 3 and 4. Such is shown as collectively having the greatest amount of radiation-transmissive area in comparison to successive annular regions there-about having respectively lower radiation-transmissive area. Four different radiation-transmissive regions, (including mid-portion 78) are shown within example continuous area 76. More or fewer than four such regions may be used as desired for ultimately achieving the desired profile of sidewalls 42 for opening 38 in insulator material 20. FIG. 15 shows but one example masking tool that may be used in accordance with method embodiments of the invention. Other existing or later-developed masking tools may be used (e.g., using half-tone techniques and/or half-tone masking tools).

Embodiments of the invention encompass structure independent of method of manufacture, yet which may be manufactured in accordance with any of the method aspects described above. In some embodiments, a substrate (e.g., 10) comprises a pair of immediately-adjacent integrated-circuit dies (e.g., 113, 114) having scribe-line area (e.g., 115) there-between. At least one of the dies comprises insulating material (e.g., 12) above integrated circuitry. The insulating material has an opening (e.g., 36) therein that extends elevationally inward to an upper conductive node (e.g., 14) of integrated circuitry within the one die. The one die comprises a conductive line (e.g., 52) of an RDL (e.g., 46) above the insulating material. The RDL-conductive line extends elevationally inward into the opening and is directly electrically coupled to the upper conductive node. The insulating material has a minimum elevational thickness (e.g., T1 in FIG. 14) from an uppermost surface (e.g., 16) of the upper conductive node to an uppermost surface (e.g., 23 in FIG. 14) of the insulating material that is immediately-adjacent the insulating-material opening.

Insulator material (e.g., 20) is above a conductive test pad (e.g., 18) in the scribe-line area. The insulator material has an opening therein (e.g., 38 in FIG. 14) that extends elevationally inward to an uppermost surface (e.g., 22) of the conductive test pad. The insulator material has a minimum elevational thickness (e.g., T2 in FIG. 14) from the conductive test pad uppermost surface to an uppermost surface (e.g., 27 in FIG. 14) of the insulator material that is immediately-adjacent the insulator-material opening and that is less than said minimum elevational thickness of the insulating material.

In one embodiment, the minimum elevational thickness of the insulator material is no more than half of the minimum elevational thickness of the insulating material, in one embodiment is half, and in one embodiment is less than half of the minimum elevational thickness of the insulating material. In one embodiment, the minimum elevational thickness of the insulator material is less than 45% of the minimum elevational thickness of the insulating material.

In one embodiment, the insulator-material opening has a minimum width (e.g., W1 in FIG. 14) at the uppermost surface of the conductive test pad that is less than a minimum width of a top (e.g., W2 in FIG. 14) of the insulator-material opening, and in one embodiment wherein top minimum width of the insulator-material opening is at least 150% of the minimum width of the insulator-material opening at the uppermost surface of the conductive test pad.

Any other attribute(s) or aspect(s) as shown and/or described herein with respect to other embodiments may be used.

Figure 16:
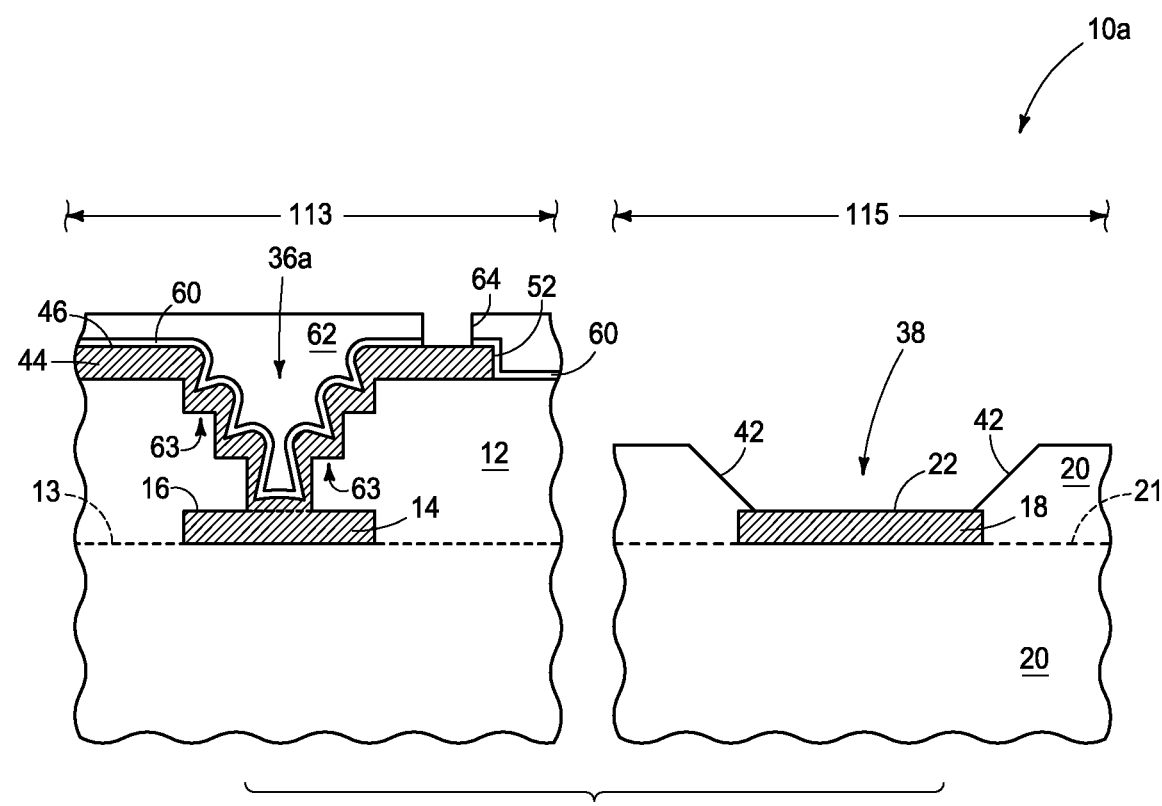
FIG. 16 is a diagrammatic cross-sectional view of a portion of a substrate in accordance with an embodiment of the invention.

In one embodiment, the insulating-material opening has at least one annular ledge elevationally between a top and a bottom of the insulating-material opening, and in one embodiment has more than one such annular ledge. An example such embodiment is shown in FIG. 16. Like numerals from the above described embodiments have been used where appropriate, with some construction differences being indicated with the suffix "a" or with different numerals. Example insulating-material opening 36a is shown as having two annular ledges 63 between a top and a bottom of insulating-material opening 36a. Example techniques for forming insulating-material opening 36a are disclosed in U.S. patent application Ser. No. 15/981,599, filed on the same day as this application, which is included as an "Appendix" hereto, which is incorporated by reference fully herein as constituting a part this disclosure. Accordingly, by way of example, the insulating-material opening and any material therein may have any of the attributes of the Appendix hereto. Any other attribute(s) or aspect(s) as shown and/or described herein with respect to other embodiments may be used.

Embodiments of the invention encompass a structure within a scribe-line area of a substrate (e.g., 10, 10a). Such a structure comprises a conductive test pad (e.g., 18). Insulator material (e.g., 20) is above the conductive test pad. The insulator material has an opening therein (e.g., 38 in FIG. 14) that extends elevationally inward to an uppermost surface (e.g., 22) of the conductive test pad. At least a majority of sidewalls (e.g., 42) of the opening are at least 25° from vertical. Any other attribute(s) or aspect(s) as shown and/or described herein with respect to other embodiments may be used.

In some prior constructions and prior methods, RDL-conductive material remained atop conductive test pad structures in scribe-line area. This led to generation of cracks during dicing/sawing that in some instances extended into die area and destroyed the circuitry therein and thus destroyed the die. At least some embodiments of the invention may preclude RDL-conductive material as being a part of the conductive test pad structure and at least reduce risk of crack generation during dicing.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or later-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a substrate comprises a pair of immediately-adjacent integrated-circuit dies having scribe-line area there-between. At least one of the dies comprises insulting material above integrated circuitry. The insulating material has an opening therein that extends elevationally inward to an upper conductive node of integrated circuitry within the one die. The one die comprises a conductive line of an RDL above the insulating material. The RDL-conductive line extends elevationally inward into the opening and is directly electrically coupled to the upper conductive node. The insulating material has a minimum elevational thickness from an uppermost surface of the upper conductive node to an uppermost surface of the insulating material that is immediately-adjacent the insulating-material opening. Insulator material is above a conductive test pad in the scribe-line area. The insulator material has an opening therein that extends elevationally inward to an uppermost surface of the conductive test pad. The insulator material has a minimum elevational thickness from the conductive-test-pad uppermost surface to an uppermost surface of the insulator material that is immediately-adjacent the insulator-material opening and that is less than said minimum elevational thickness of the insulating material.

In some embodiments, a substrate comprises a pair of immediately-adjacent integrated-circuit dies having scribe-line area there-between. At least one of the dies comprises insulting material above integrated circuitry. The insulating material has an opening therein that extends elevationally inward to an upper conductive node of integrated circuitry within the one die. The one die comprises a conductive line of an RDL above the insulating material. The RDL-conductive line extends elevationally inward into the opening and is directly electrically coupled to the upper conductive node. The insulating material has a minimum elevational thickness from an uppermost surface of the upper conductive node to an uppermost surface of the insulating material that is immediately-adjacent the insulating-material opening. Insulator material is above a conductive test pad in the scribe-line area. The insulator material has an opening therein that extends elevationally inward to an uppermost surface of the conductive test pad. The insulator material has a minimum elevational thickness from the conductive-test-pad uppermost surface to an uppermost surface of the insulator material that is immediately-adjacent the insulator-material opening and that is less than said minimum elevational thickness of the insulating material. At least a majority of sidewalls of the insulator-material opening are straight linear and at least 25° from vertical.

In some embodiments, a structure within a scribe-line area of a substrate comprises a conductive test pad. Insulator material is above the conductive test pad. The insulator material has an opening therein that extends elevationally inward to an uppermost surface of the conductive test pad. At least a majority of sidewalls of the opening are at least 25° from vertical.

In some embodiments, a method of forming a conductive line of an RDL of a substrate and of forming a structure within a scribe-line area of the substrate comprises forming a pair of immediately-adjacent integrated-circuit dies having scribe-line area there-between. The dies individually comprise an upper conductive node of integrated circuitry and insulating material directly above the upper conductive node. The scribe-line area comprises a conductive test pad and insulator material directly above the conductive test pad. RIM is being directly above the insulating material and the insulator material. A die opening is formed through the RIM to the insulating material directly above the upper conductive node in individual of the dies. A test-pad opening is formed into the RIM directly above the conductive test pad. The RIM is elevationally between a bottom of the RIM-test-pad opening and the insulator material. The RIM is used as masking material while simultaneously etching: a) the insulating material through the RIM-die opening to form an insulating-material opening to the upper conductive node, and b) the insulator material through the RIM-test-pad opening to form an insulator-material opening directly above the conductive test pad. The insulator-material is elevationally between a bottom of the insulator-material opening and the conductive test pad. Conductive material of an RDL, is formed above the insulating material and above the insulator material and into the insulating-material opening and into the insulator-material opening. The RDL-conductive material is directly electrically coupled to the upper conductive node. The insulator material is elevationally between the RDL-conductive material and the conductive test pad. The RDL-conductive material is patterned to form an RDL-conductive line in the individual dies and to remove all of the RDL-conductive material from being within the insulator-material opening. Thereafter, a sufficient amount of the insulator material is removed from within the insulator-material opening to upwardly expose the conductive test pad.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A substrate comprising:
  a pair of immediately-adjacent integrated-circuit dies having scribe-line area there-between;
  at least one of the dies comprising insulting material above integrated circuitry, the insulating material having an opening therein that extends elevationally inward to an upper conductive node of integrated circuitry within the one die, the one die comprising a conductive line of a redistribution layer (RDL) above the insulating material, the RDL-conductive line extending elevationally inward into the opening and being directly electrically coupled to the upper conductive node, the insulating material having a minimum elevational thickness from an uppermost surface of the upper conductive node to an uppermost surface of the insulating material that is immediately-adjacent the insulating-material opening;
  insulator material above a conductive test pad in the scribe-line area, the insulator material having an opening therein that extends elevationally inward to an uppermost surface of the conductive test pad, the insulator material having a minimum elevational thickness from the conductive-test-pad uppermost surface to an uppermost surface of the insulator material that is immediately-adjacent the insulator-material opening and that is less than said minimum elevational thickness of the insulating material;
  the insulating-material opening having at least one annular ledge elevationally between a top and a bottom of the insulating-material opening;
  a first insulative material in the insulating-material opening; and
  a second insulative material in the insulating-material opening, the second insulative material being a top and directly against the first insulative material in the insulating-material opening and being of different composition from that of the first insulative material.

2. The substrate of claim 1 wherein the insulating material and the insulator material are of the same composition.

3. The substrate of claim 1 wherein said minimum elevational thickness of the insulator material is no more than half of said minimum elevational thickness of the insulating material.

4. The substrate of claim 3 wherein said minimum elevational thickness of the insulator material is half of said minimum elevational thickness of the insulating material.

5. The substrate of claim 3 wherein said minimum elevational thickness of the insulator material is less-than-half of said minimum elevational thickness of the insulating material.

6. The substrate of claim 5 wherein said minimum elevational thickness of the insulator material is less than 45% of said minimum elevational thickness of the insulating material.

7. The substrate of claim 1 wherein the insulator-material opening has a minimum width at the uppermost surface of the conductive test pad that is less than a minimum width of a top of the insulator-material opening.

8. The substrate of claim 7 wherein top minimum width is at least 150% of the minimum width at the uppermost surface of the conductive test pad.

9. The substrate of claim 1 wherein at least a majority of sidewalls of the insulator-material opening are at least 25° from vertical.

10. The substrate of claim 9 wherein the at least a majority of the sidewalls are straight linear.

11. The substrate of claim 1 wherein the first insulative material is thinner than the second insulative material.

12. The substrate of claim 1 wherein the first insulative material comprises silicon nitride.

13. The substrate of claim 1 wherein the second insulative material comprises polyimide.

14. The substrate of claim 1 wherein the first insulative material comprises silicon nitride and the second insulative material comprises polyimide.

15. The substrate of claim 1 wherein the first insulative material is thinner than the second insulative material, the first insulative material comprises silicon nitride, and the second insulative material comprises polyimide.

16. A substrate comprising:
a pair of immediately-adjacent integrated-circuit dies having scribe-line area there-between;
at least one of the dies comprising insulting material above integrated circuitry, the insulating material having an opening therein that extends elevationally inward to an upper conductive node of integrated circuitry within the one die, the one die comprising a conductive line of a redistribution layer (RDL) above the insulating material, the RDL-conductive line extending elevationally inward into the opening and being directly electrically coupled to the upper conductive node, the insulating material having a minimum elevational thickness from an uppermost surface of the upper conductive node to an uppermost surface of the insulating material that is immediately-adjacent the insulating-material opening;
insulator material above a conductive test pad in the scribe-line area, the insulator material having an opening therein that extends elevationally inward to an uppermost surface of the conductive test pad, the insulator material having a minimum elevational thickness from the conductive-test-pad uppermost surface to an uppermost surface of the insulator material that is immediately-adjacent the insulator-material opening and that is less than said minimum elevational thickness of the insulating material; and
the insulating-material opening having more than one annular ledge elevationally between a top and a bottom of the insulating-material opening, the annular ledges being at different elevations relative one another, the RDL-conductive line being directly against the annular ledges.

17. The substrate of claim 1 wherein the upper conductive-node-uppermost surface and the conductive-test-pad-uppermost surface are at a same elevation within the substrate.

* * * * *